(12) United States Patent
Pifferi et al.

(10) Patent No.: US 9,921,080 B2
(45) Date of Patent: Mar. 20, 2018

(54) USING HALL SENSORS TO DETECT INSERTION AND LOCKING OF A PORTABLE DEVICE IN A BASE

(71) Applicant: Datalogic IP Tech S.r.l., Lippo di Calderara di Reno (IT)

(72) Inventors: Marco Pifferi, Predosa (IT); Alessio Riccardi, Casalmaggiore (IT)

(73) Assignee: DATALOGIC IP TECH S.R.L., Bologna (IT)

( * ) Notice: Subject to any disclaimer, the term of this patent is extended or adjusted under 35 U.S.C. 154(b) by 84 days.

(21) Appl. No.: 14/997,070

(22) Filed: Jan. 15, 2016

(65) Prior Publication Data

US 2017/0176214 A1    Jun. 22, 2017

Related U.S. Application Data

(60) Provisional application No. 62/269,742, filed on Dec. 18, 2015.

(51) Int. Cl.
| | |
|---|---|
| *G01B 7/14* | (2006.01) |
| *G01B 7/30* | (2006.01) |
| *G01R 33/06* | (2006.01) |
| *H01L 43/06* | (2006.01) |
| *G01D 5/14* | (2006.01) |

(Continued)

(52) U.S. Cl.
CPC ............ *G01D 5/145* (2013.01); *G01D 5/142* (2013.01); *G01D 18/00* (2013.01); *G01R 15/20* (2013.01);

(Continued)

(58) Field of Classification Search
CPC ...... G01D 5/142; G01R 15/20; G01R 15/202; G01R 21/08; G01R 33/06; G01R 33/07; G01R 33/077

(Continued)

(56) References Cited

U.S. PATENT DOCUMENTS

| 7,683,572 B2 | 3/2010 | Toya |
|---|---|---|
| 8,629,652 B2 | 1/2014 | Partovi et al. |

(Continued)

FOREIGN PATENT DOCUMENTS

| WO | WO201399222 | 4/2013 |
|---|---|---|
| WO | WO201488164 | 12/2014 |

OTHER PUBLICATIONS

European Search Report dated Apr. 11, 2017 in European Patent Application No. 16204979.5, 8 pages.

*Primary Examiner* — Raul Rios Russo
(74) *Attorney, Agent, or Firm* — Shook, Hardy & Bacon L.L.P.

(57) ABSTRACT

A mounting assembly and method that utilize Hall effect sensors to detect orientation and insertion of a portable device in a base are provided. Hall effect sensors positioned on one of a portable device and a base are arranged to interact with one or more magnets positioned on the other of the portable device or the base such that a change in proximity of at least one of the magnets to at least one of the sensors will cause the sensor to output a voltage signal that differs depending on the nearness of the magnet. Depending on at least one of the magnitude of the signal, the profile of the signal over time, and the identity of the sensor that output the signal, it is determined whether the orientation of the portable device in the base is correct and/or if the portable device is fully inserted in the base.

27 Claims, 14 Drawing Sheets

(51) Int. Cl.
  *G01D 18/00* (2006.01)
  *G01R 21/08* (2006.01)
  *G01R 15/20* (2006.01)
  *G01R 33/07* (2006.01)
(52) U.S. Cl.
  CPC ........... *G01R 15/202* (2013.01); *G01R 21/08* (2013.01); *G01R 33/06* (2013.01); *G01R 33/07* (2013.01); *G01R 33/077* (2013.01)
(58) Field of Classification Search
  USPC ............ 324/51, 55, 200, 207.11, 207.2, 251
  See application file for complete search history.

(56) References Cited

U.S. PATENT DOCUMENTS

| | | |
|---|---|---|
| 8,629,653 B2 | 1/2014 | Mochida et al. |
| 8,896,264 B2 | 11/2014 | Partovi |
| 2002/0068533 A1* | 6/2002 | Bilotti ............... H03K 17/9517 455/550.1 |
| 2006/0022822 A1 | 2/2006 | Wong et al. |
| 2006/0069837 A1* | 3/2006 | Zhang ................... G06F 1/1632 710/303 |
| 2009/0009233 A1 | 1/2009 | Shah et al. |
| 2010/0081473 A1 | 4/2010 | Chatterjee et al. |
| 2010/0214094 A1* | 8/2010 | Givens ................... B66C 13/44 340/539.17 |
| 2011/0012727 A1* | 1/2011 | Pance ................. G06F 13/4068 340/505 |
| 2011/0074349 A1 | 3/2011 | Ghovanloo |
| 2012/0154288 A1* | 6/2012 | Walker ................. G06F 1/1616 345/169 |
| 2012/0206088 A1 | 8/2012 | Park |
| 2015/0070007 A1* | 3/2015 | Kurniawan ............ G01R 35/00 324/251 |
| 2015/0316394 A1 | 11/2015 | Kim et al. |
| 2016/0316050 A1* | 10/2016 | Lombardi ........... H04M 1/7253 |

\* cited by examiner

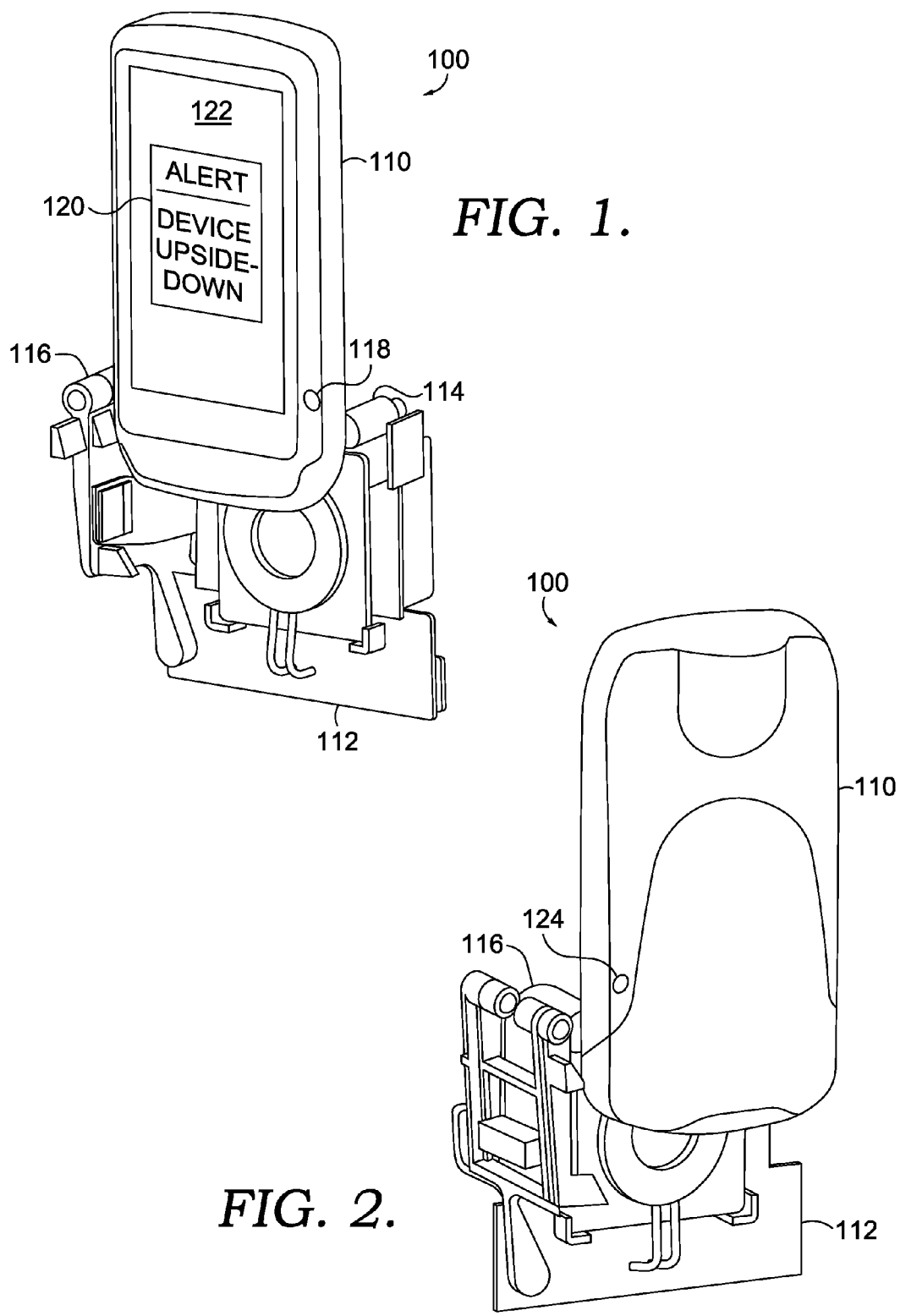

USING HALL SENSORS TO DETECT INSERTION AND LOCKING OF A PORTABLE DEVICE IN A BASE

CROSS-REFERENCE TO RELATED APPLICATIONS

This application claims priority to U.S. Provisional Patent Application No. 62/269,742 entitled "Using Hall Sensors to Detect Insertion and Locking of a Portable Device in a Base," filed Dec. 18, 2015, which is incorporated herein by reference in its entirety.

TECHNICAL FIELD

The present invention relates to using contact-less sensors to detect proper insertion and locking of a portable device in a base. More particularly, the present invention relates to using Hall effect sensors to detect proper orientation and complete insertion of a portable device, for instance a portable electronic device, in a mating seat or base.

BACKGROUND OF THE INVENTION

Portable electronic devices are becoming increasingly common in the modern world. Portable electronic devices often are positioned on a base or cradle for transmitting information to and from such devices and/or for battery charging between locationally-remote uses, among other functions. As such, correct and complete insertion is critical to proper functioning of many portable devices.

Some mounting assemblies (that is, some combinations of a portable device and a base) include complementary contacts that signal proper orientation and insertion. Other mounting assemblies, however, do not have such contacts. The absence of contacts between the portable device and the base increases the opportunities for improper functioning of such devices. This is particularly the case in devices having a symmetrical form factor where improper insertion within a base can be frequent.

These cases may be managed by an orientation and insertion mechanism which is able to detect proper orientation and complete insertion of a portable device in a base or cradle in the absence of contacts.

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Additional objects, advantages, and novel features of the invention will be set forth in part in the description which follows, and in part will become apparent to those skilled in the art upon examination of the following, or may be learned by practice of embodiments of the invention.

Embodiments of the present invention generally relate to using contact-less sensors, e.g., Hall effect sensors, to detect orientation and insertion of a portable device in a mating seat or base. Hall effect sensors (that is, sensors that output varying voltage in response to a magnetic field) coupled with at least one of a portable device and a base are arranged to interact with one or more magnets coupled with at least the other of the portable device or the base such that a change in the proximity of at least one of the magnets to at least one of the sensors will cause the sensor to output a voltage signal that differs depending on the nearness of the magnet. Depending on at least one of the magnitude of the signal, the voltage profile of the signal over time, and the identity of the sensor that output the signal, it is determined whether the orientation of the portable device in the base is correct (i.e., if the front-back orientation and/or the top-to-bottom orientation in the base is correct) and/or if the portable device is fully inserted in the base such that, for instance, communications and battery charging may take place in a reliable way.

A mounting assembly in accordance with aspects hereof allows for orientation and insertion detection of a portable device in a base where the mounting assembly is free of contacts that would otherwise detect positioning, the mounting assembly being simpler and less expensive than alternative contact-less arrangements, e.g., three-dimensional magnetic sensor arrays. In embodiments, a mounting assembly and contact-less position-detection method as described herein is suitable for wirelessly charged devices, for achieving optimal coupling where there is tight geometrical alignment between a portable device and a base, and for detecting situations where an obstacle interferes with the coupling of the portable device and the base, giving the false impression that the portable device is completely inserted when it is not.

BRIEF DESCRIPTION OF THE SEVERAL VIEWS OF THE DRAWING

In the accompanying drawings which form a part of the specification and which are to be read in conjunction therewith, and in which like reference numerals are used to indicate like parts in the various views:

FIG. 1 depicts a schematic diagram of an exemplary mounting assembly wherein the portable device is inserted in the base a correct front-to-back and incorrect top-to-bottom orientation, in accordance with embodiments of the present invention;

FIG. 2 depicts a schematic diagram of an exemplary mounting assembly wherein the portable device is inserted in the base in an incorrect front-to-back and incorrect top-to-bottom orientation, in accordance with embodiments of the present invention;

DETAILED DESCRIPTION OF THE INVENTION

Figure 3:
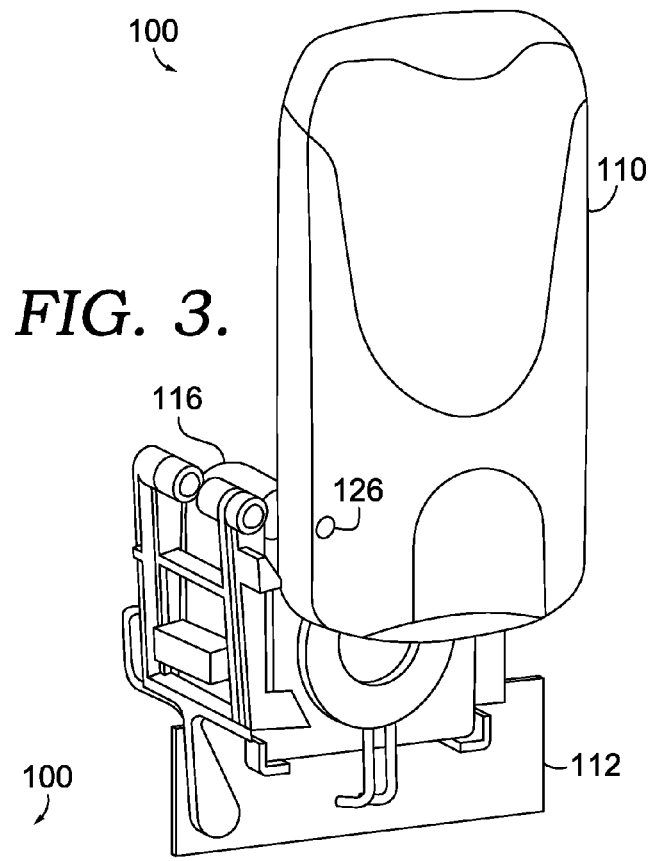
FIG. 3 depicts a schematic diagram of an exemplary mounting assembly wherein the portable device is inserted in the base in an incorrect front-to-back and correct top-to-bottom orientation, in accordance with embodiments of the present invention.

The subject matter of embodiments of the present invention is described with specificity herein to meet statutory requirements. But the description itself is not intended to define what is regarded as the invention, which is what the claims do. The claimed subject matter might be embodied in other ways to include different steps or combinations of steps similar to the ones described in this document, in conjunction with other present or future technologies. Terms should not be interpreted as implying any particular order among or between various steps herein disclosed unless and except when the order of individual steps is explicitly described.

Embodiments of the present invention generally relate to using contact-less sensors to detect the orientation and the adequacy of insertion of a portable device in a mating seat or base. In embodiments, the mating seat or base includes a mechanical locking mechanism and is geometrically-conformed to receive and temporarily secure the portable device. Exemplary contact-less portable devices that may benefit from an arrangement in accordance with aspects hereof include portable electronic devices (such as scanning devices and the like), wirelessly charged devices, and devices for which achieving optimal coupling is complicated by tight geometrical alignment between the device and the base. Proper insertion of a portable device in a mating seat or base aids in, among other things, insuring that communications and battery charging take place in a reliable way.

In exemplary embodiments, the contact-less sensors utilized are Hall effect sensors. As known to those having ordinary skill in the relevant art, Hall effect sensors are contact-less sensors that output varying voltage over time in response to a magnetic field. Thus, proximity to a magnetic field over time and detected coincident voltage signal(s) output by one or more Hall effect sensors may be utilized to determine the orientation and/or positioning of the sensor(s) with respect to one or more magnets. Hall effect sensors and the details of their assembly and functioning are known to those having ordinary skill in the art and, accordingly, are not further described herein.

Exemplary embodiments include Hall effect sensors coupled with at least one of the portable device and the base, cooperatively arranged such that they output voltage signals of varying magnitudes over time based upon interaction with one or more magnets coupled with at least the other of the portable device or the base. In this way a change, over time, in the proximity of at least one of the magnets to at least one of the sensors will cause the sensor to output a voltage signal that differs depending on the nearness of the magnet. Depending on at least one of the magnitude of the signal, the profile of the signal over time, and the identity of the sensor that output the signal, it is determined whether the orientation of the portable device in the base is correct (i.e., if the front-to-back orientation and/or the top-to-bottom orientation in the base is correct) and/or if the portable device is fully inserted in the base such that, for instance, communications and battery charging may take place in a reliable way.

In a first aspect, a mounting assembly for sensing correct device orientation is provided. The mounting assembly includes a portable device, a base that is geometrically-conformed to mate with the portable device, a plurality of Hall sensors coupled with at least one of the portable device and the base, and at least one magnet coupled with the other of the portable device and the base. The magnet and the plurality of Hall sensors are cooperatively arranged such that proximity of the at least one magnet over time causes at least one of the plurality of Hall effect sensors to output an altered voltage signal when orientation of the portable device in the base is incorrect.

In another aspect, a method for sensing full insertion of a portable device in a base that is geometrically conformed to mate with the portable device is provided. The method includes providing the portable device with at least one magnet coupled therewith; providing the geometrically-conformed base with a first Hall effect sensor coupled therewith; detecting a first output-voltage profile for the first Hall effect sensor over a first period of time, the first period of time being associated with insertion of the portable device in the base; and comparing the first output-voltage profile to a first expected voltage profile for the first Hall effect sensor to determine if threshold similarity exists there between. Threshold similarity between the first output-voltage profile and the first expected voltage profile is indicative of full insertion of the portable device in the base and less than threshold similarity between the first output-voltage profile and the first expected voltage profile is indicative of inadequate insertion of the portable device in the base.

In yet another aspect, a method for sensing full insertion of a portable device in a base that is geometrically conformed to mate with the portable device is provided, the portable device and the geometrically-conformed base comprising a mounting assembly. The method includes calibrating the mounting assembly by measuring a first minimum voltage signal and a first maximum voltage signal output from a Hall effect sensor, the Hall effect sensor being arranged in association with the geometrically-conformed base such that the Hall effect sensor detects a magnetic field associated with at least one magnet coupled with a locking mechanism that temporarily secures the portable device in position when the portable device is fully inserted in the base. The first minimum voltage signal and the first maximum voltage signal are measured as the portable device is inserted in the base. Calibrating the mounting assembly further includes determining amplification values for the first minimum voltage signal and the first maximum voltage signal, amplifying the first minimum voltage signal and the first maximum voltage signal utilizing the amplification values, and storing the amplified minimum voltage signal and the amplified maximum voltage signal in association with the mounting assembly.

Using Hall Effect Sensors to Detect Proper Device Orientation

As previously set forth, proper orientation of a portable device in a mating seat or base aids in, among other things, insuring that communications and battery charging take place in a reliable way. "Orientation," as the term is utilized herein, refers to both the front-to-back orientation of a device in a complimentary base as well as the top-to-bottom orientation of the device in the complimentary base. Many devices, particularly those having a symmetrical form factor, may suffer from frequent inadvertent improper orientation. When improperly inserted, front-to-back, top-to-bottom, or both, functions (such as communications and battery charging) cannot take place.

As such, embodiments of the present invention provide a mounting assembly for sensing correct device orientation in a complimentary base. Embodiments hereof further provide method for sensing correct device orientation utilizing a mounting assembly as described herein. A "mounting assembly," as the term is utilized herein, refers to the combination of a portable device and a complimentary base. Generally, the base is geometrically-conformed to mate with the complimentary portable device. Mounting assemblies in accordance with embodiments of the present invention include a combination of a plurality of Hall effect sensors and at least one magnet cooperatively arranged such that the proximity of the at least one magnet over time causes one or more of the Hall effect sensors to output an altered signal when orientation of the portable device is incorrect. When referring herein to an "altered" signal, the term is intended to encompass any change in the output voltage of a Hall effect sensor. Thus, an "altered" signal may be a voltage signal of increased magnitude relative to a baseline, a voltage signal of decreased magnitude relative to a baseline, or the lack of a voltage signal where the baseline state included a voltage signal. The baseline state of the output generally refers to the voltage output state prior to coupling (or attempted coupling) of the portable device and the complimentary base.

Embodiments of the present invention contemplate that each of the plurality of Hall effect sensors is a digital Hall effect sensor. Embodiments hereof further contemplate a combination of a plurality of Hall effect sensors and at least one magnet cooperatively arranged such that proximity of the at least one magnet causes one or more of the Hall effect sensors to output an altered signal when orientation of the portable device is correct. Any and all such variations, and any combination thereof, are contemplated to be within the scope of embodiments of the present invention.

Depending on at least one of the magnitude of an altered signal, the profile of an output signal over time, and the identity of the sensor that output the signal, embodiments of the present invention permit determining whether the orientation of the portable device in the base is correct (i.e., if the front-to-back orientation and/or the top-to-bottom orientation in the base is correct) or incorrect. Embodiments further contemplate identifying the nature of an incorrect orientation.

Generally, portable devices may be inserted in a complimentary base in one of four orientations: correct front-to-back and incorrect top-to-bottom orientation, incorrect front-to-back and incorrect top-to-bottom orientation, incorrect front-to-back and correct top-to-bottom orientation, and correct front-to-back and correct top-to-bottom orientation. Referring now to FIG. 1, a schematic diagram is depicted of an exemplary mounting assembly 100 having a portable device 110 inserted in a base 112 in a correct front-to-back and incorrect top-to-bottom orientation, in accordance with embodiments of the present invention. The exemplary mounting assembly 100 includes two magnets 114, 116 coupled with the base 112. The exemplary mounting assembly 100 further includes four Hall effect sensors coupled with the portable device 110, although only a first 118 of the Hall effect sensors is visible in the view illustrated in FIG. 1.

Insertion of the portable device 110 in the base 112 as shown in FIG. 1 causes at least the first Hall effect sensor 118 to output an altered voltage signal due to the proximity of the first Hall effect sensor 118 and the magnet 114. In accordance with embodiments of the present invention, an altered voltage signal output from the first Hall effect sensor 118 indicates correct front-to-back orientation and incorrect top-to-bottom orientation. Embodiments hereof further contemplate that altered output from more than one of the four Hall effect sensors may be output when the portable device 110 is incorrectly inserted in the base 112. For instance, correct front-to-back orientation and incorrect top-to-bottom orientation may be indicated by altered output signals from both the first Hall effect sensor 118 and the third Hall effect sensor (reference numeral 126 (see FIG. 3)). Any and all such variations, and any combination thereof, are contemplated to be within the scope of embodiments hereof.

Upon detection of an altered signal output from at least the first Hall effect sensor 118, embodiments hereof contemplate outputting of an alert that indicates to the user that the orientation of the portable device 110 in the base 112 is incorrect. The alert may be, by way of example only, illumination of at least a portion of the portable device 110, a vibration of the portable device 110, or a graphical user interface 120 presented in association with a display area 122 of the portable device 110. In embodiments, the graphical user interface 120 may include an indication that orientation is incorrect and/or may include an indication of the nature of the incorrect orientation (e.g., "Device Upside-Down"), as shown in FIG. 1. Any and all such variations, and any combination thereof, are contemplated to be within the scope of embodiments of the present invention.

Turning to FIG. 2, a schematic diagram is depicted of the exemplary mounting assembly 100 of FIG. 1 having the portable device 110 inserted in the base 112 in an incorrect front-to-back and incorrect top-to-bottom orientation, in accordance with embodiments of the present invention. The exemplary mounting assembly 100 illustrates one of the two magnets 116 coupled with the base 112. The exemplary mounting assembly 100 further includes four Hall effect sensors coupled with the portable device 110, although only a second 124 of the Hall effect sensors is visible in the view illustrated in FIG. 2.

Insertion of the portable device 110 in the base 112 as shown in FIG. 2 causes at least the second Hall effect sensor 124 to output an altered voltage signal due to the proximity of the second Hall effect sensor 124 and the magnet 116. In accordance with embodiments of the present invention, an altered voltage signal output from the second Hall effect sensor 124 indicates incorrect front-to-back and incorrect top-to-bottom orientation. Embodiments hereof further contemplate that altered output from more than one of the four Hall effect sensors may be output when the portable device 110 is incorrectly inserted in the base 112. For instance, incorrect front-to-back and incorrect top-to-bottom orientation may be indicated by altered output signals from both the first Hall effect sensor 118 and the fourth Hall effect sensor (reference numeral 128 (see FIG. 4)). Any and all such variations, and any combination thereof, are contemplated to be within the scope of embodiments hereof.

Upon detection of an altered signal output from at least the second Hall effect sensor 124, embodiments hereof contemplate outputting of an alert that indicates to the user that the orientation of the portable device 110 in the base 112 is incorrect. The alert may be, by way of example only, illumination of at least a portion of the portable device 110, a vibration of the portable device 110, or a graphical user interface presented in association with a display area of the portable device 110 (not shown in FIG. 2). In embodiments, the graphical user interface may include an indication that orientation is incorrect and/or may include an indication of the nature of the incorrect orientation (e.g., "Device Backward and Upside Down"). Any and all such variations, and any combination thereof, are contemplated to be within the scope of embodiments of the present invention.

Referring now to FIG. 3, a schematic diagram is depicted of the exemplary mounting assembly 100 of FIG. 1 having the portable device 110 inserted in the base 112 in an incorrect front-to-back and correct top-to-bottom orientation, in accordance with embodiments of the present invention. The exemplary mounting assembly 100 illustrates one of the two magnets 116 coupled with the base 112. The exemplary mounting assembly 100 further includes four Hall effect sensors coupled with the portable device 110, although only a third 126 of the Hall effect sensors is visible in the view illustrated in FIG. 3.

In embodiments, insertion of the portable device 110 in the base 112 as shown in FIG. 3 causes at least the third Hall effect sensor 126 to output an altered voltage signal due to the proximity of the third Hall effect sensor 126 and the magnet 116. In accordance with embodiments of the present invention, an altered voltage signal output from the third Hall effect sensor 126 indicates incorrect front-to-back and correct top-to-bottom orientation. Embodiments hereof further contemplate that altered output from more than one of the four Hall effect sensors may be output when the portable device 110 is incorrectly inserted in the base 112. For instance, incorrect front-to-back and correct top-to-bottom orientation may be indicated by altered output signals from both the third Hall effect sensor 126 and the first Hall effect sensor (reference numeral 118 (see FIG. 1)). Any and all such variations, and any combination thereof, are contemplated to be within the scope of embodiments hereof.

Upon detection of an altered signal output from at least the third Hall effect sensor 126, embodiments hereof contemplate outputting of an alert that indicates to the user that the orientation of the portable device 110 in the base 112 is incorrect. The alert may be, by way of example only, illumination of at least a portion of the portable device 110, a vibration of the portable device 110, or a graphical user interface presented in association with a display area of the portable device 110 (not shown in FIG. 3). In embodiments, the graphical user interface may include an indication that orientation is incorrect and/or may include an indication of the nature of the incorrect orientation (e.g., "Device Backward and Upside Down"). Any and all such variations, and any combination thereof, are contemplated to be within the scope of embodiments of the present invention.

Figure 4:
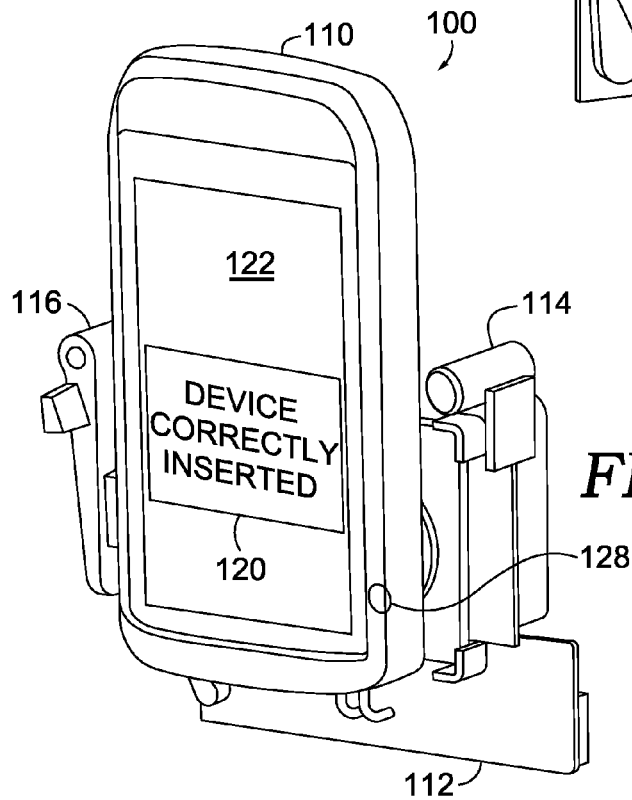
FIG. 4 depicts a schematic diagram of an exemplary mounting assembly wherein the portable device is inserted in the base in a correct front-to-back and correct top-to-bottom orientation, in accordance with embodiments of the present invention.

Turning to FIG. 4, a schematic diagram is depicted of the exemplary mounting assembly 100 of FIG. 1 having the portable device 110 inserted in the base 112 in a correct front-to-back and correct top-to-bottom orientation, in accordance with embodiments of the present invention. The exemplary mounting assembly 100 illustrates the two magnets 114, 116 coupled with the base 112. The exemplary mounting assembly 100 further includes four Hall effect sensors coupled with the portable device 110, although only a fourth 128 of the Hall effect sensors is visible in the view illustrated in FIG. 4.

In embodiments, insertion of the portable device 110 in the base 112 as shown in FIG. 4 causes at least the fourth Hall effect sensor 128 to output an altered voltage signal due to the proximity of the fourth Hall effect sensor 128 and the magnet 114. In accordance with embodiments of the present invention, an altered voltage signal output from the fourth Hall effect sensor 128 indicates correct front-to-back and correct top-to-bottom orientation. Embodiments hereof further contemplate that altered output from more than one of the four Hall effect sensors may be output when the portable device 110 is incorrectly inserted in the base 112. For instance, incorrect front-to-back and incorrect top-to-bottom orientation may be indicated by altered output signals from both the fourth Hall effect sensor 128 and the first Hall effect sensor (reference numeral 118 (see FIG. 1)). Any and all such variations, and any combination thereof, are contemplated to be within the scope of embodiments hereof.

Upon detection of an altered signal output from at least the fourth Hall effect sensor 128, embodiments hereof contemplate outputting of an alert that indicates to the user that the orientation of the portable device 110 in the base 112 is correct. The alert may be, by way of example only, illumination of at least a portion of the portable device 110, a vibration of the portable device 110, or a graphical user interface 120 presented in association with a display area 122 of the portable device 110. In embodiments, the graphical user interface 120 may include an indication that orientation is correct (e.g., "Device Correctly Inserted"). Any and all such variations, and any combination thereof, are contemplated to be within the scope of embodiments of the present invention.

As illustrated in FIG. 4, correct front-to-back and correct top-to-bottom insertion of the portable device 110 in the base 112 causes the device to slide into the base 112 to a greater extent than the incorrect insertion embodiments (FIGS. 1, 2 and 3). As such, embodiments hereof contemplate that proximity of the fourth Hall effect sensor 128 may be insufficient to cause output of an altered voltage signal. Accordingly, embodiments hereof additionally contemplate that in the absence of an altered voltage signal, correct front-to-back and correct top-to-bottom insertion may be signaled by initiation of functions (e.g., battery charging and communications) rather than (or in addition to), an output voltage signal from at least the fourth Hall effect sensor 128. Any and all such variations, and any combination thereof, are contemplated to be within the scope of embodiments hereof.

A First Method for Using Hall Effect Sensors to Detect Full Device Insertion

As previously set forth, in addition to correct orientation, full insertion of a portable device in a mating seat or base aids in, among other things, insuring that communications and battery charging take place in a reliable way. "Full insertion," as the term is utilized herein, refers to insertion of a portable device within a complimentary base that is sufficient to produce a mechanical and an electrical locked or secured state.

In this first method for using Hall effect sensors to detect full device insertion, the time-varying output profile of one or more Hall effect sensors is recorded and compared, via a correlation technique (more fully described below), to an expected time profile (independent of tolerance in the Hall sensor(s) signal, amplitude, and offset). A method in accordance with this aspect of the present invention is less prone to false contacts due to soiled contacts (using prior art contact-based sensing systems) and also account for situations where an obstacle obtrudes the base, giving the false impression that the portable device is fully inserted when it, in fact, is not. Also contemplated is a mounting apparatus having the structure as described in the context of the present method.

Figure 5:
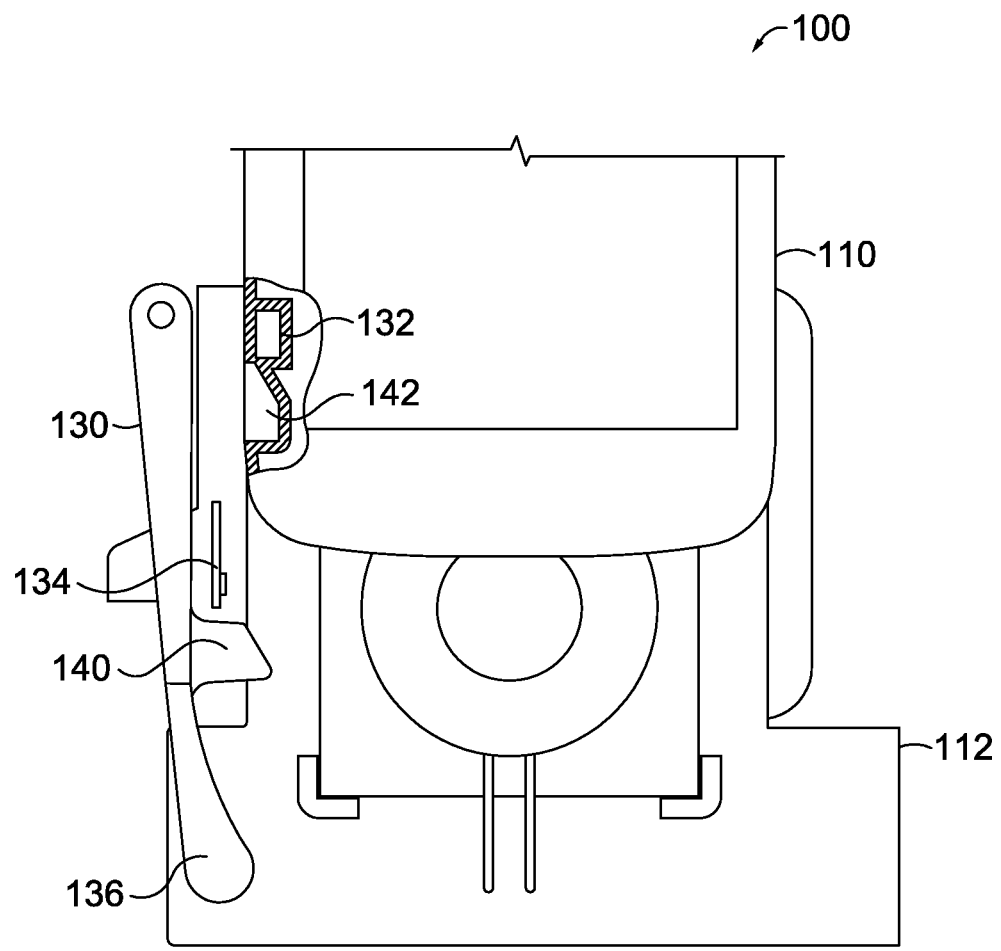
FIG. 5 depicts a schematic diagram of an exemplary mounting assembly having both a mechanical locking mechanism and an electrical locking detection mechanism, in accordance with embodiments of the present invention.

With reference to FIG. 5, depicted is a schematic diagram of a portion of the exemplary mounting assembly 100 of FIGS. 1-4 having both a mechanical locking mechanism (locking lever 130) and an electrical locking detection mechanism. The electrical locking detection mechanism is comprised of a first magnet 132 coupled with the portable device 110, a first Hall effect sensor 134 coupled with the base 112, a second magnet 136 coupled with the mechanical locking lever 130, and a second Hall effect sensor 138 (not visible in FIG. 5) coupled with the base 112. The mechanical locking lever 130 includes a protruded area 140 configured for receipt in a cut-out area 142 of the portable device 110. FIG. 5 illustrates a state wherein the portable device 110 is just beginning to be inserted in the base 112.

Figure 6:
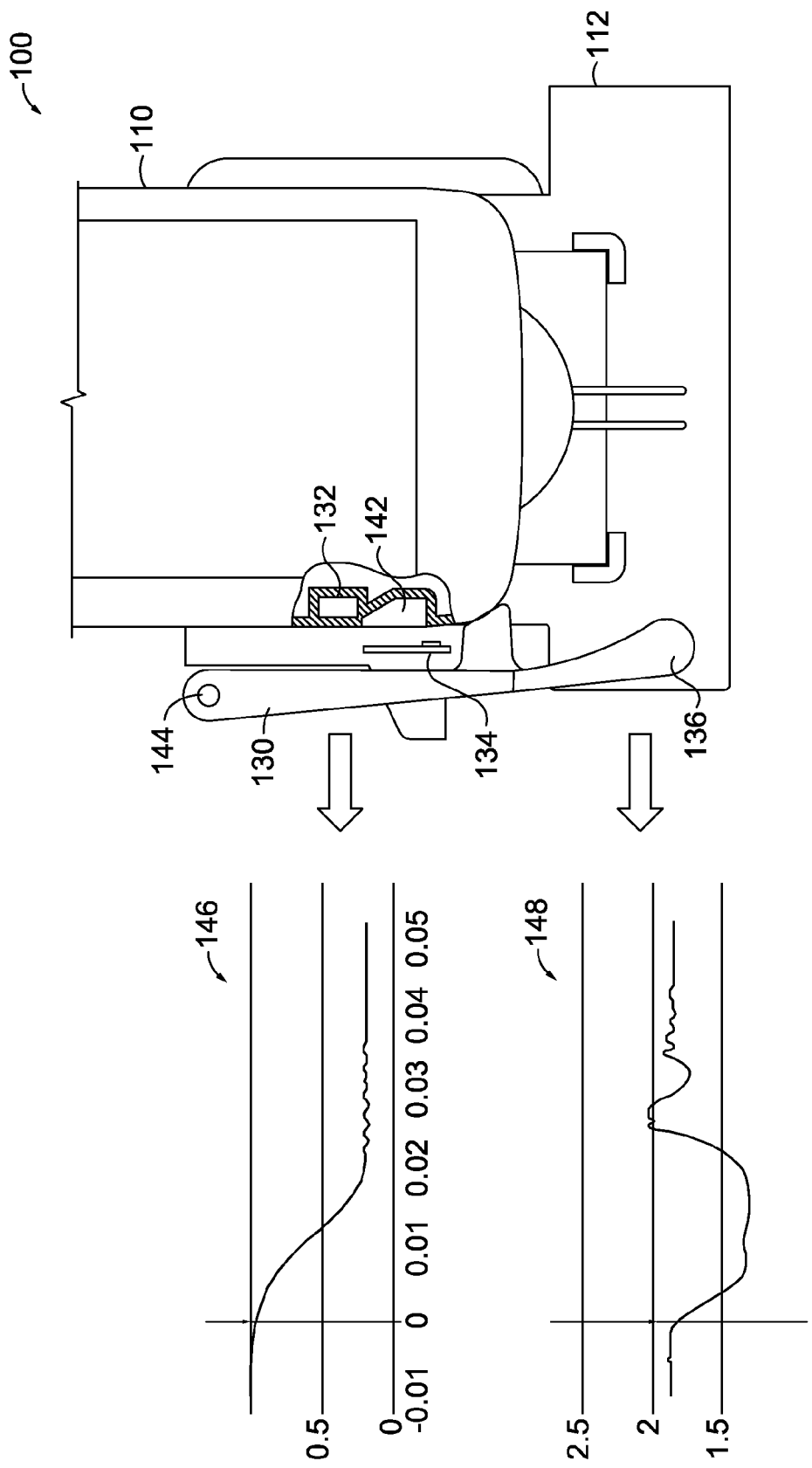
FIG. 6 depicts a schematic diagram of the mounting assembly of FIG. 5 as the portable device approaches a mechanically and electrically secured state, in accordance with embodiments of the present invention.

With reference to FIG. 6, depicted is a schematic diagram of the mounting assembly 100 of FIG. 5 as the portable device 110 begins to approach a mechanically and electrically secured state. Mechanically, the portable device 110 is illustrated as approaching the protruded area 140 of the mechanical locking lever 130. Further, the first magnet 132 on the portable device 110 is illustrated as approaching the first Hall effect sensor 134. Electrically, as the portable device 110 is inserted in the base 112, an output-voltage profile for the first Hall effect sensor begins to be recorded as it is output. The output-voltage profile for the first Hall effect sensor is illustrated as reference numeral 146. The arrow to the far left indicates that recording of the profile is just beginning. Also illustrated is an output-voltage profile 148 for the second Hall effect sensor 138, the output-voltage profile 148 also just beginning to be recorded.

Figure 7:
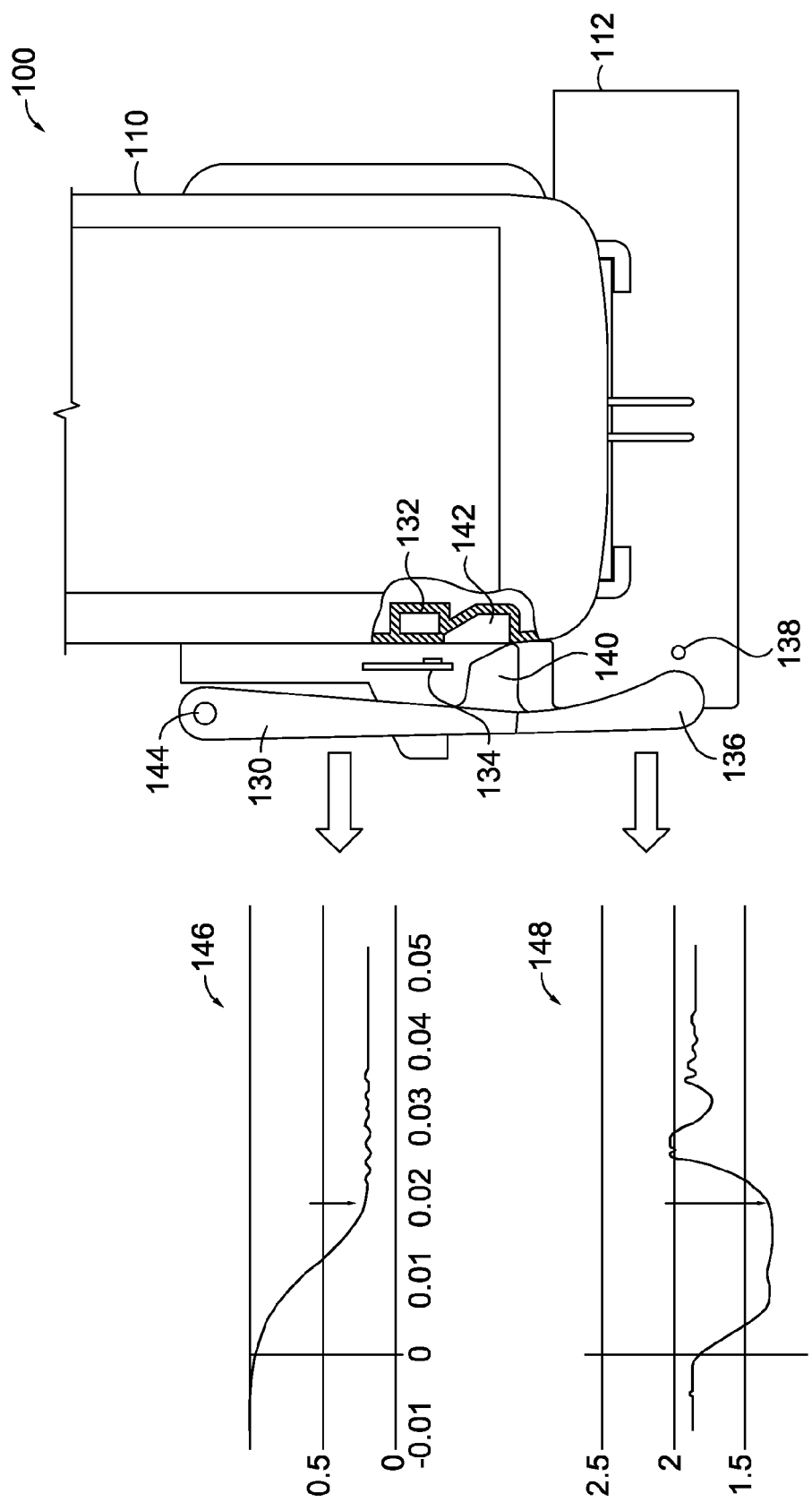
FIG. 7 depicts a schematic diagram of the mounting assembly of FIGS. 5 and 6 as the portable device becomes closer to a mechanically and electrically secured state than depicted in FIG. 6, in accordance with embodiments of the present invention.

Turning now to FIG. 7, depicted is a schematic diagram of the mounting assembly 100 of FIGS. 5 and 6 as the portable device 110 becomes closer to a mechanically and electrically secured state than depicted in FIG. 6. As the portable device 110 contacts the protruded area 140 of the mechanical locking lever 130, the lever 130 pivots about a pivot point 144. This causes movement of the second magnet 136 with respect to the second Hall effect sensor 138, altering the voltage signal output from the second Hall effect sensor 138.

Figure 8:
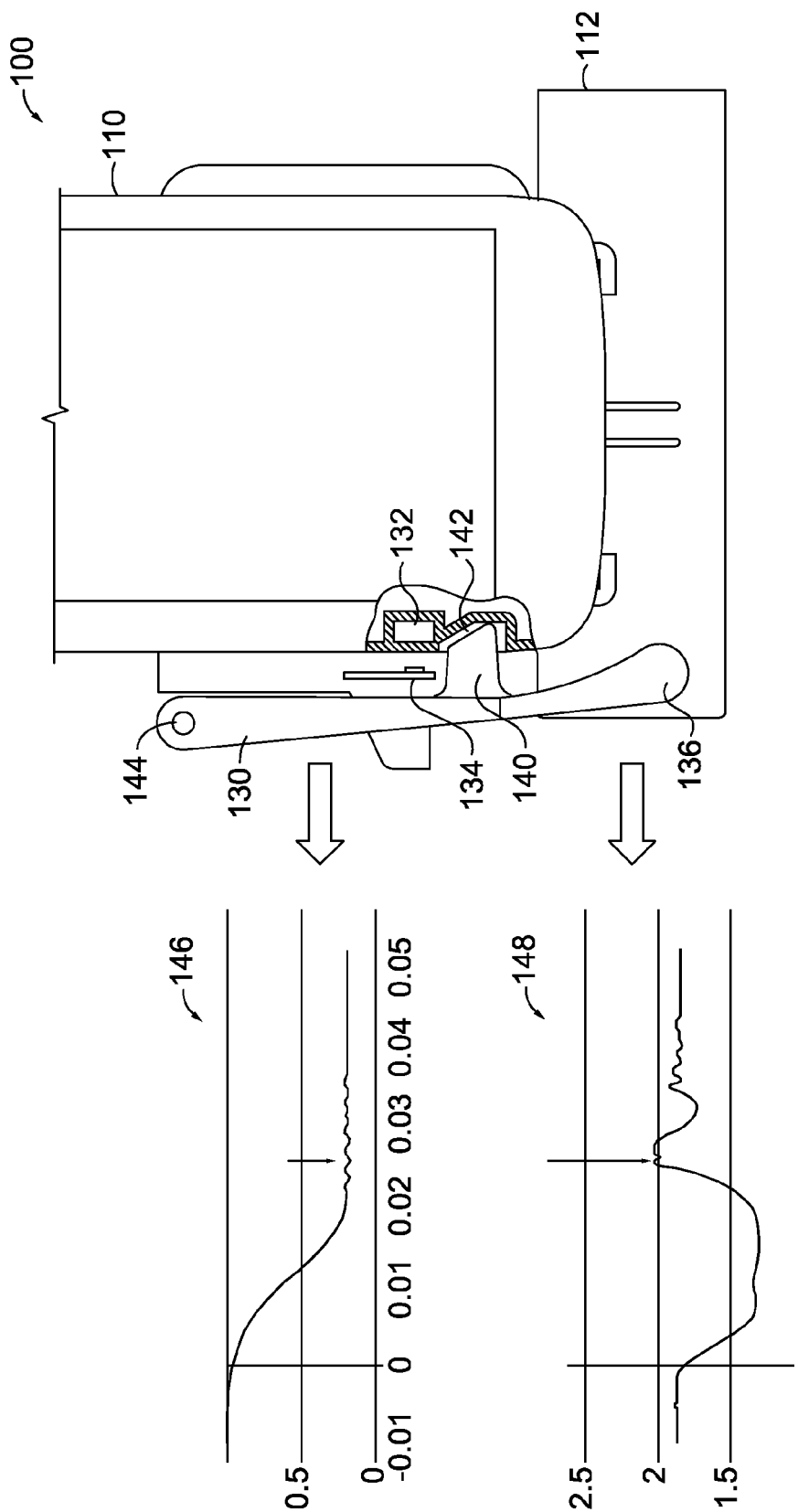
FIG. 8 depicts a schematic diagram of the mounting assembly of FIGS. 5, 6 and 7 having the portable device in a mechanically and electrically secured state, in accordance with embodiments of the present invention.

Referring now to FIG. 8, depicted is a schematic diagram of the mounting assembly of FIGS. 5, 6 and 7 having the portable device 110 in a mechanically and electrically secured state. Mechanically, the protruded area 140 of the mechanical locking lever 130 is temporarily secured within the cut-out area 142 of the portable device 110. This state is indicative of mechanical locking.

Figure 9:
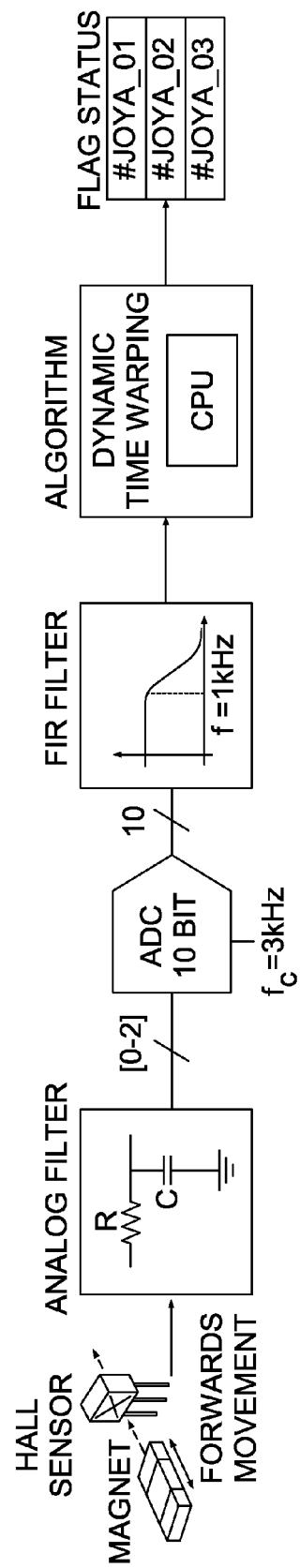
FIG. 9 schematically depicts a process for digitalizing analog samples, in accordance with embodiments of the present invention.

To determine if the portable device 110 is also electrically locked in the base 112, the output-voltage profile 146 for the first Hall effect sensor 134 is compared with an expected output voltage profile for the first Hall effect sensor 134. In embodiments, the output-voltage profile 148 for the second Hall effect sensor 138 likewise is compared with an expected output-voltage profile for the second Hall effect sensor 138. Embodiments hereof contemplate that the first Hall effect sensor 134 and the second Hall effect sensor 138 are analog or linear sensors. Thus, in accordance with embodiments of the present invention, the outputs for the sensors 134, 138 are digitalized and exploited in order to assess the adequacy of the electrical coupling, i.e., to assess whether the portable device 110 is proximate enough to its expected position to permit coupling or locking. If the portable device 110 is ill-positioned, an alert may be activated, for instance, illuminating the portable device 110, vibrating the portable device 110, presenting a message in association with a graphical user interface associated with the device 110, or the like. To remove mechanical and electrical tolerances, a like-hood process is utilized in accordance with embodiments hereof in order to remove offset and variation in speed of insertion and sensor gain. When the process causes recognition of a correct insertion and locking, a flag is set and functions (such as battery charging and communication) are permitted. FIG. 9 illustrates a brief description of an exemplary process used to digitalize the analog samples.

In accordance with embodiments hereof, the voltage signals of the Hall effect sensor outputs have characteristics that may vary from product to product. For instance, the amplitude, the time duration, the offset and the average value may vary be different factors including the mechanical structure and the orientation of the magnets that constitute the system. For at least these reasons, embodiments hereof seek to find an optimal alignment between two given sequences under certain restrictions. In embodiments, the alignment is based on the Dynamic Time Warping (DTW) distance which permits non-linear mapping of one signal to another by minimizing the distance between the two sequences.

The effectiveness of this process increases if the time interval, in which the data are analyzed, increases. This aspect contrasts with the limited storage capacity of microcontrollers in today's market. For at least this reason, an analog and a digital filter are utilized to reduce the sampling frequency. In this way, it is possible to increase the time windows in which the input signals are analyzed by the process and correctly detect the insertion of the portable device in the complimentary base.

Figure 13:
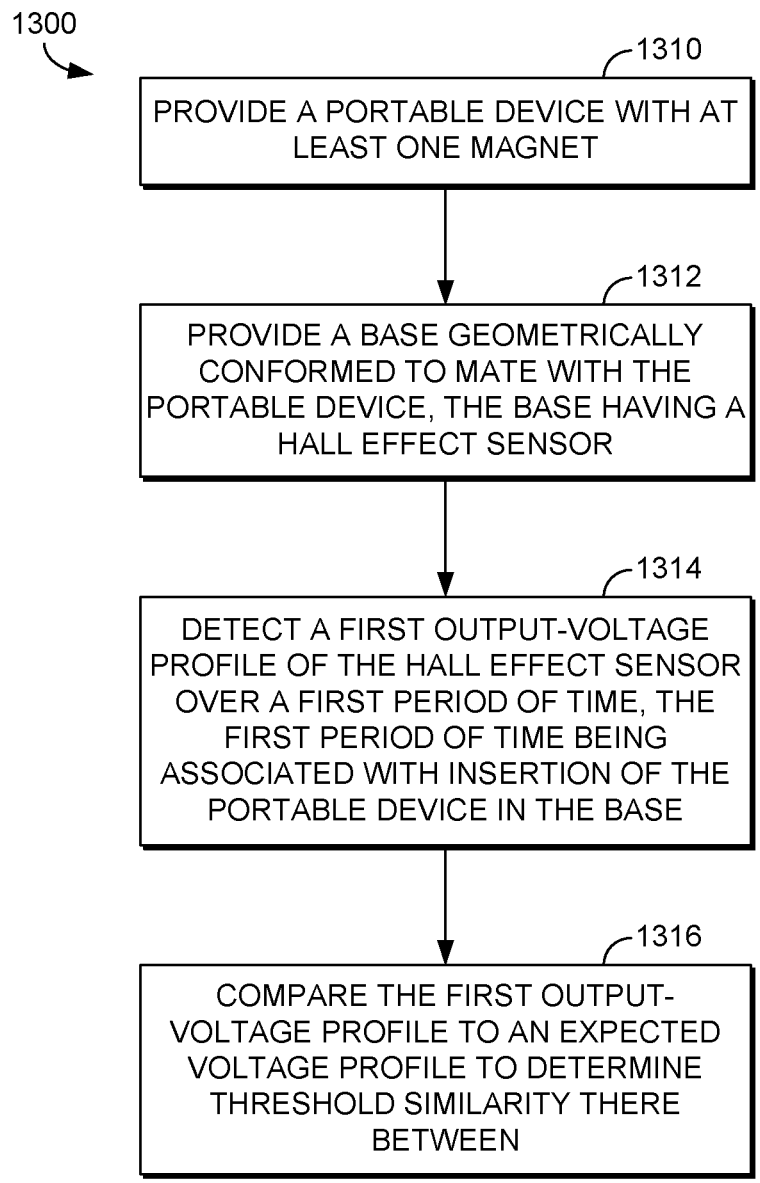
FIG. 13 depicts a flow diagram of a method for sensing full insertion of a portable device in a base that is geometrically conformed to mate with the portable device, in accordance with embodiments of the present invention.

Turning now to FIG. 13, a method, in accordance with embodiments hereof, for sensing full insertion of a portable device in a base that is geometrically conformed to mate with the portable device, is illustrated and designated generally as reference numeral 1300. As indicated at block 1310, a portable device is provided having at least one magnet coupled therewith. As indicated at block 1312, also provided is a geometrically-conformed base having a first Hall effect sensor coupled therewith. As indicated at block 1314, a first output-voltage profile is detected for the first Hall effect sensor over a first period of time, the first period of time being associated with insertion of the portable device in the base. As indicated at block 1316, the first output-voltage profile is compared to a first expected voltage profile for the first Hall effect sensor to determine if there is threshold similarity there between. Threshold similarity between the first output-voltage profile and the first expected voltage profile is indicative of full insertion of the portable device in the base. Less than threshold similarity between the first output-voltage profile and the first expected voltage profile is indicative of inadequate insertion of the portable device in the base.

A Second Method for Using Hall Effect Sensors to Detect Full Device Insertion

Since the variations of voltage signals output from a Hall effect sensor depend on the mechanical and electrical structures of the various components that build the chain for detecting the insertion of the portable device in the base, a second method for processing the voltage signals may be utilized in accordance with embodiments hereof. This second method, instead of evaluating the signal trend over time, is based on a standard calibration of the analog Hall effect sensors during the production process in order to evaluate when signals from the Hall effect sensors exceed predefined thresholds. Also contemplated is a mounting apparatus having the structure as described in the context of the present method.

Often, the same portable device may be inserted into multiple bases. For instant, a hand-held barcode scanner having a certain model number may be able to be inserted into any number of complimentary bases designed to seat a barcode scanner having the same model number. In an initial calibration step, variations in the mechanical properties and electrical properties of Hall effect sensors coupled with various bases are considered to be different for different bases. Conversely, when dealing with a single base having Hall effect sensors coupled therewith, it is considered that the mechanical and electrical characteristics of the signal output from a coupled sensor do not vary over time.

Given these considerations, in embodiments of the present invention, a minimum voltage signal and a maximum voltage signal are measured from a given Hall effect sensor during production by means of a calibration phase. In embodiments, the Hall effect sensor is arranged in association with a geometrically-conformed base such that the Hall effect sensor detects a magnetic field associated with at least one magnet coupled with a locking mechanism that temporarily secures the portable device in position when the portable device is fully inserted in the base, as described above with reference to FIGS. 5-8. The minimum voltage signal and the maximum voltage signal are measured as the portable device is properly and fully inserted in the base.

Figure 10:
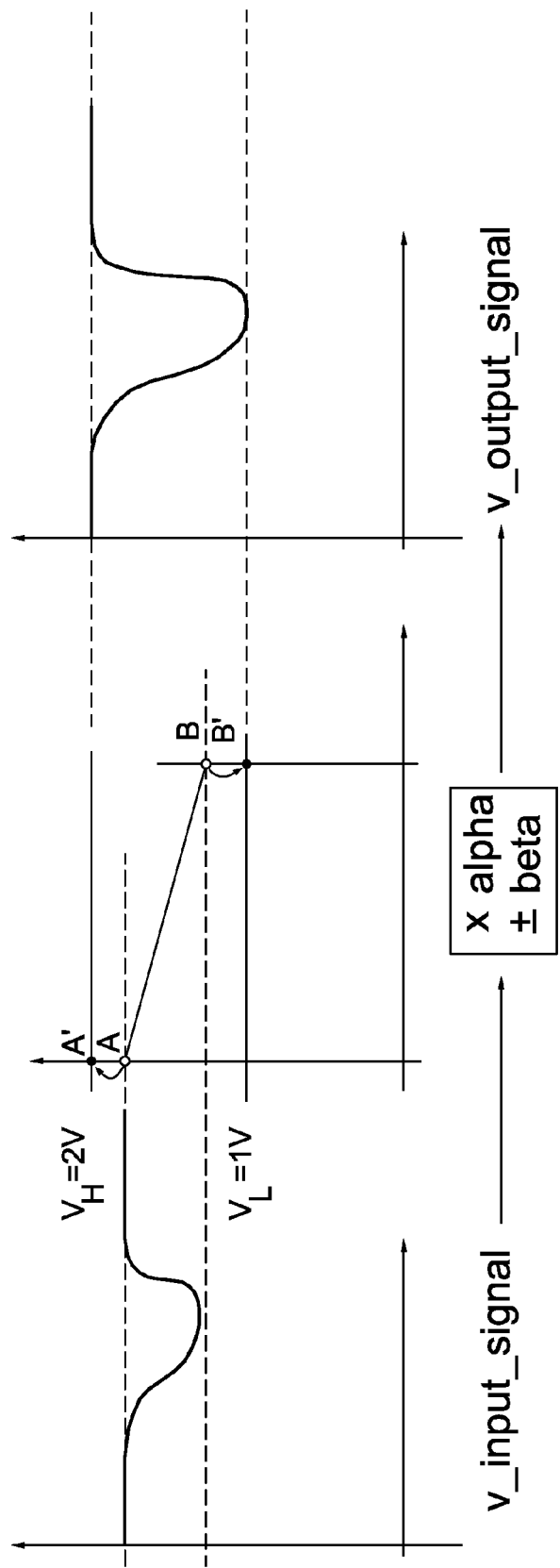
FIG. 10 schematically depicts calibration of a Hall effect sensor, in accordance with embodiments of the present invention.
Figure 11:
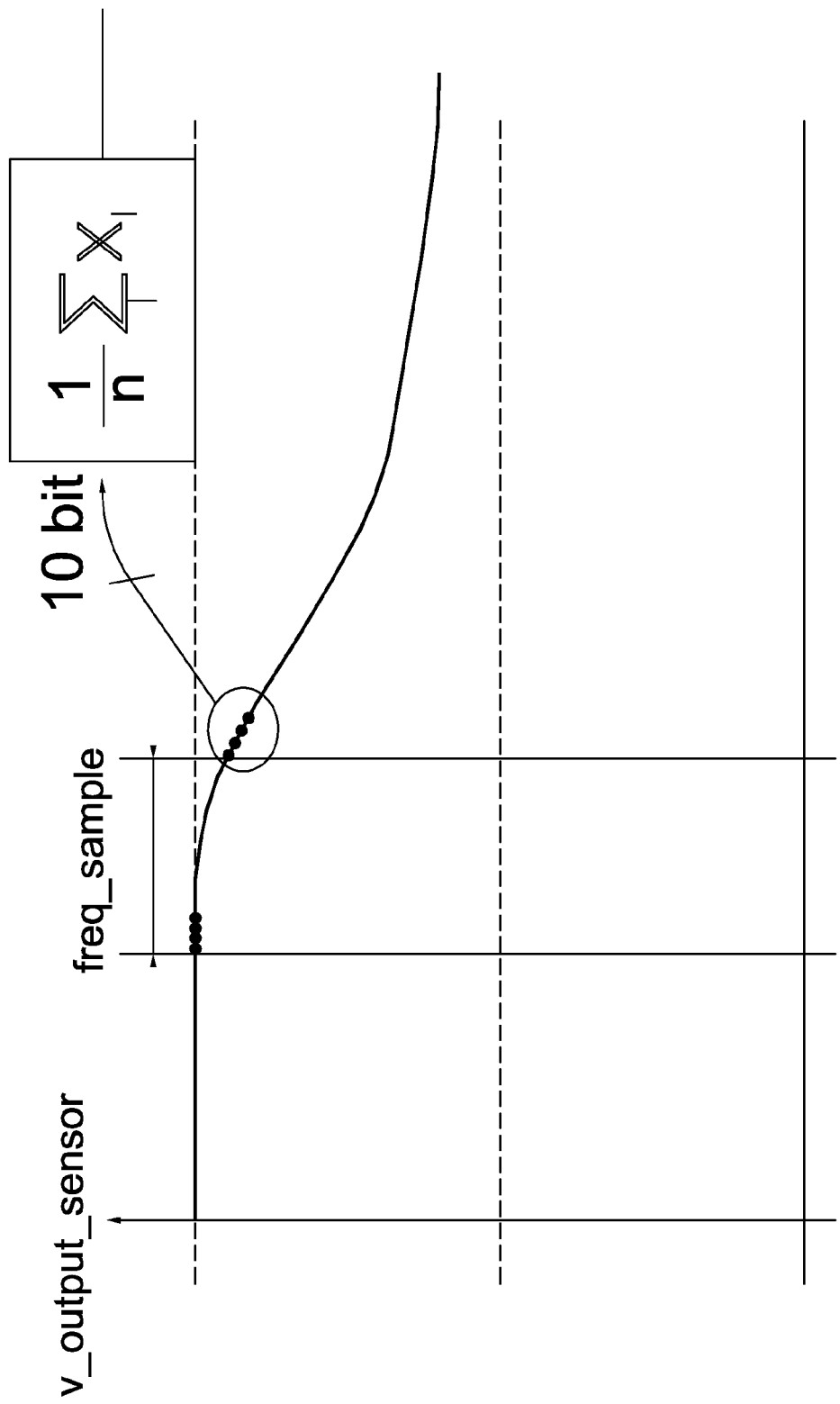
FIG. 11 schematically depicts calculation of output waveforms from Hall effect sensors associated with various bases, in accordance with embodiments of the present invention.
Figure 12:
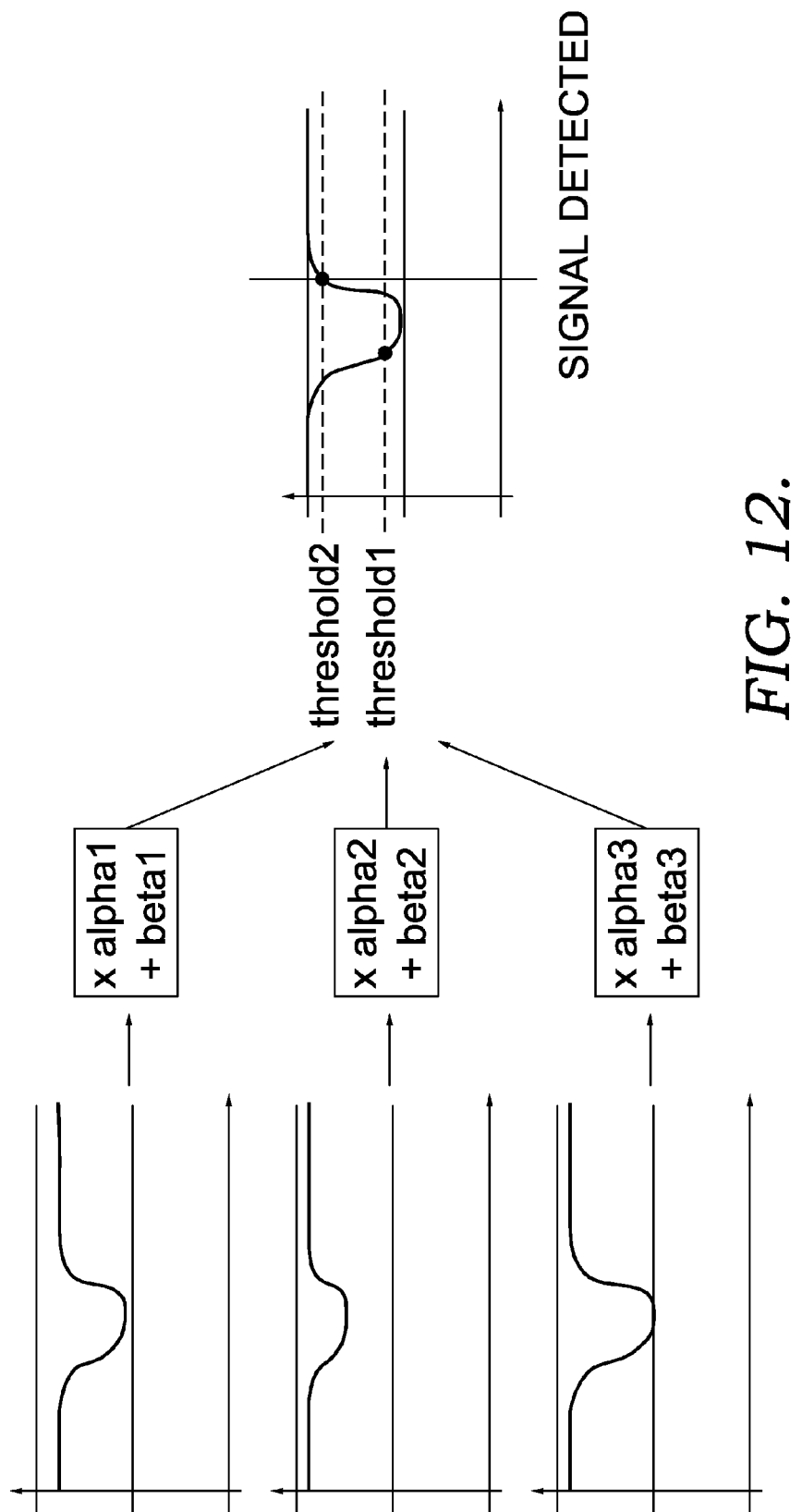
FIG. 12 schematically depicts averaging a plurality of input signals, in accordance with embodiments of the present invention.

FIGS. 10 and 11 illustrate this calibration method. The purpose of calibration is to measure point A (when the locking mechanism/lever is closed) and point B (when the locking mechanism/lever is at its maximum opening point). These two values are the maximum and minimum voltage signals, respectively. After measuring these two points, amplification values for the minimum voltage signal and the maximum voltage signal are determined, the amplification values for amplifying the sampled waveform. In this way, the same waveform may be obtained for each of a plurality of bases, even if the mechanical and electrical characteristics of the different bases vary. In embodiments, to reduce noise, multiple voltage signals (each obtained via a respective insertion of the portable device into the base) may be averaged, as illustrated in FIG. 12. The resultant values are the minimum voltage threshold and the maximum voltage threshold.

Figure 14:
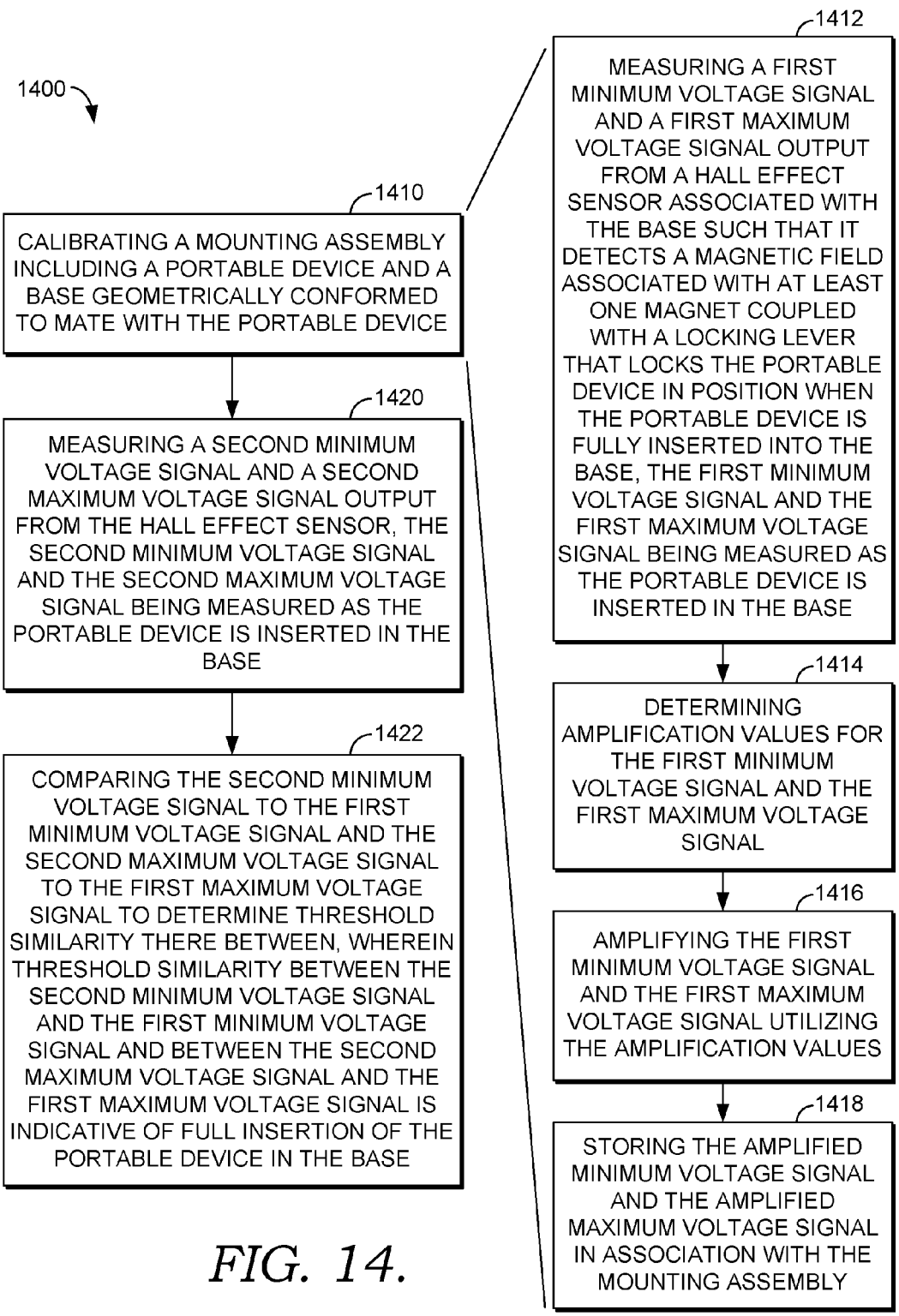
FIG. 14 depicts a flow diagram of another method for sensing full insertion of a portable device in a base, in accordance with embodiments of the present invention.

After adapting the input signal, the minimum voltage threshold and the maximum voltage threshold may be utilized to detect the full insertion of a portable device in a complimentary base. A method, in accordance with embodiments hereof, for sensing full insertion of a portable device in a base that is geometrically conformed to mate with the portable device, the portable device and the geometrically-conformed base comprising a mounting assembly, is illustrated and designated generally as reference numeral 1400 in FIG. 14. As indicated at block 1410, the mounting assembly is calibrated, as shown in more detail with reference to numerals 1412, 1414, 1416, and 1418. As indicated at block 1412, a first minimum voltage signal and a first maximum voltage signal output from a Hall effect sensor are measured, the Hall effect sensor being arranged in association with the geometrically-conformed base such that the Hall effect sensor detects a magnetic field associated with at least one magnet coupled with a locking mechanism that temporarily secures the portable device in position when the portable device is fully inserted in the base, the first minimum voltage signal and the first maximum voltage signal being measured as the portable device is inserted in the base. As indicated at block 1414, amplification values for the first minimum voltage signal and the first maximum voltage signal are determined (see, e.g., FIG. 10). As indicated at block 1416, the first minimum voltage signal and the first maximum voltage signal are amplified utilizing the amplification values. As indicated at block 1418, the amplified minimum voltage signal and the amplified maximum voltage signal are stored in association with the mounting assembly.

As indicated at block 1420, measuring a second minimum voltage signal and a second maximum voltage signal output from the Hall effect sensor are measured, the second minimum voltage signal and the second maximum voltage signal being measured as the portable device is inserted in the base. As indicated at block 1422, the second minimum voltage signal is compared to the first minimum voltage signal and the second maximum voltage signal is compared to the first maximum voltage signal to determine if there is threshold similarity there between. Threshold similarity between the second minimum voltage signal and the first minimum voltage signal and between the second maximum voltage signal and the first maximum voltage signal is indicative of full insertion of the portable device in the base.

In practice, even within the same base, mechanical and electrical properties or characteristics may vary over time. As such, in accordance with embodiments of the present invention, calibration is repeated at predetermined time intervals. After the initial calibration phase, correct and full insertion of the portable device in the base may be determined. Thus, if full insertion of the portable device is detected, the minimum and maximum voltage levels associated with points A and B may be determined. By storing these values, the values may be compared with those obtained during the initial calibration phase and the later-measured values may be corrected or adjusted accordingly. See, e.g., FIG. 10.

Using a weighted arithmetic mean, in which later-measured values associated with points A and B contribute less than those stored during the initial calibration phase (for instance, approximately 0.0 to 1.0% of the calibrated points) the first calibration may be adapted. In embodiments, the weights of the average are defined in order to follow some slow mechanical or electrical variations.

Without Self-Calibration:

The calibrated voltage is v_calibrated=v_input x alpha+ beta. For mechanical and/or electrical degradations, the alpha and beta values may change over time. If these values stay constant, full insertion of the portable device cannot be detected. See, e.g., FIG. 15.

With Self-Calibration:

In accordance with embodiments hereof, after the portable device is inserted into the base, the alpha and beta values are recalculated following the mechanical and/or electrical degradations using the following formulas:

alpha=alpha_calibrated+Δalpha.

beta=beta_calibrated+Δbeta.

Figure 15:
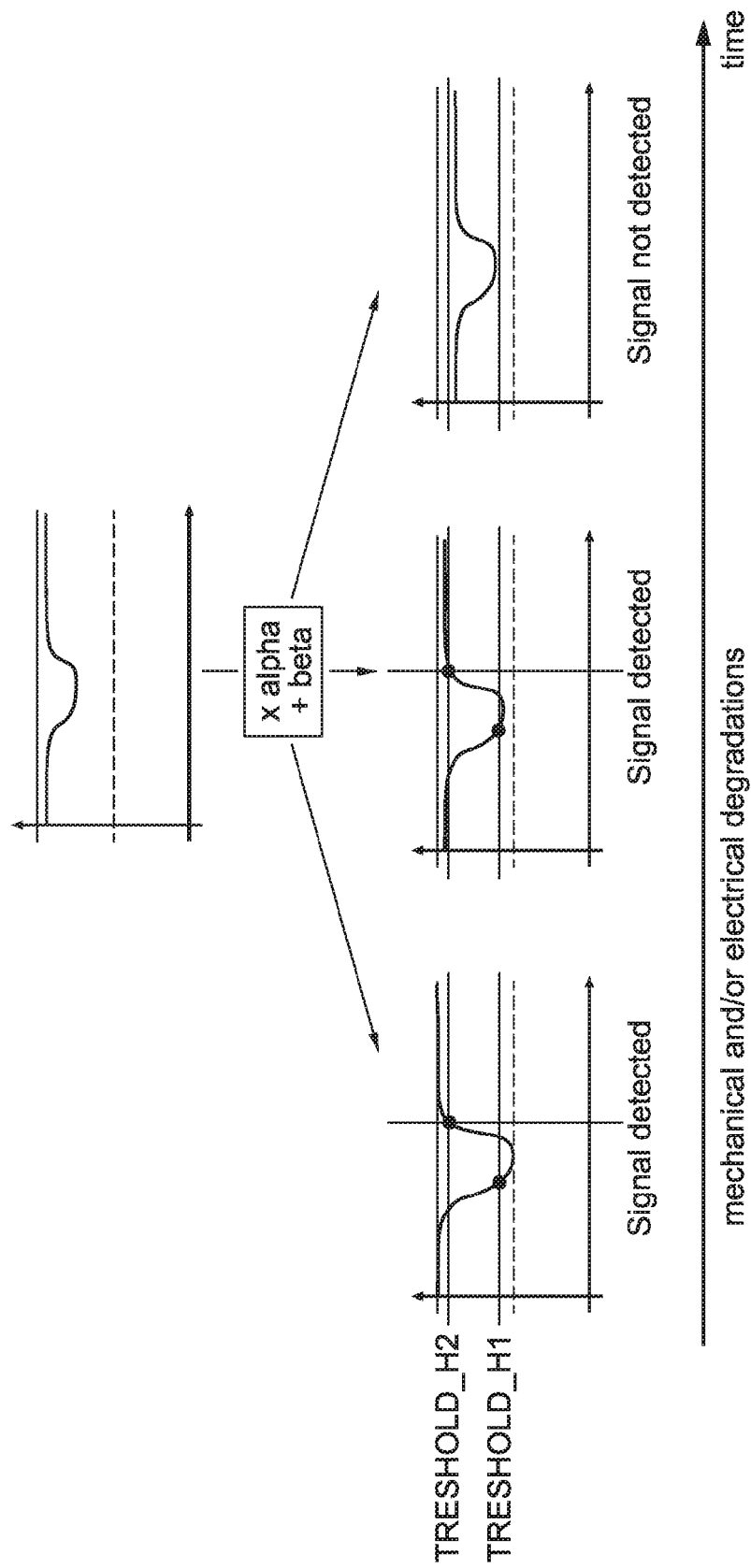
FIG. 15 schematically depicts the effect of mechanical and/or electrical degradations without self-calibration, in accordance with embodiments of the present invention.
Figure 16:
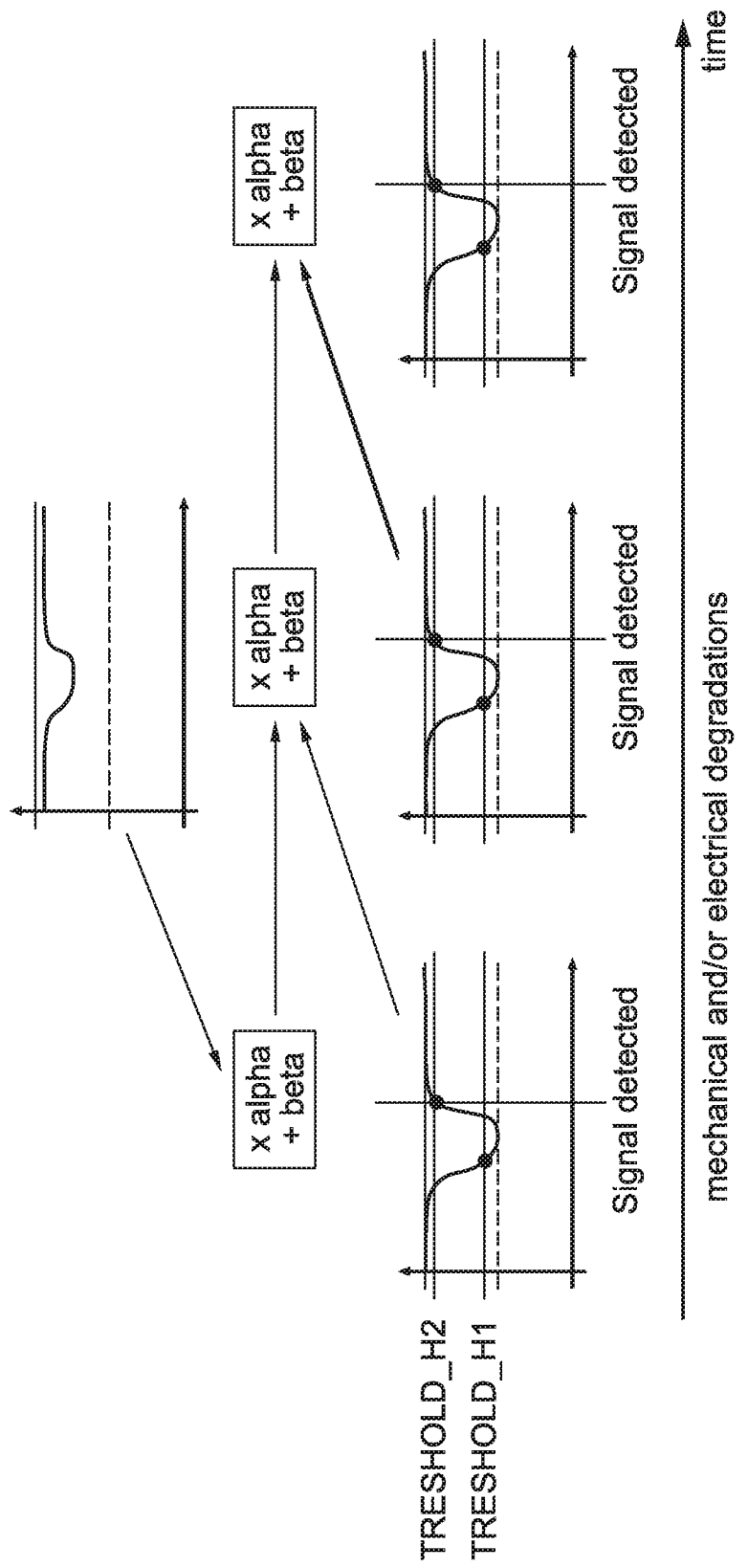
FIG. 16 schematically depicts recalculating values following mechanical and/or electrical degradations utilizing self-calibration, in accordance with embodiments of the present invention.

Using a weighted arithmetic mean, minor correction to the two coefficients may be made in order to counteract the deviations previously described with reference to FIG. 15. See, e.g., FIG. 16.

As can be seen, embodiments of the present invention generally relate to using contact-less sensors to detect the orientation and the adequacy of insertion of a portable device in a mating seat or base. Many different arrangements of the various components depicted, as well as components not shown, are possible without departing from the scope of the claims below. Embodiments of our technology have been described with the intent to be illustrative rather than restrictive. Alternative embodiments will become apparent to readers of this disclosure after and because of reading it. Alternative means of implementing the aforementioned can be completed without departing from the scope of the claims below. Certain features and sub-combinations are of utility and may be employed without reference to other features and sub-combinations and are contemplated within the scope of the claims.

The invention claimed is:

1. A mounting assembly for sensing correct device orientation, comprising:
 a portable device;
 a base geometrically conformed to mate with the portable device;
 at least four Hall effect sensors coupled with the portable device;
 at least two magnets coupled with the base, the magnets and the Hall effect sensors being cooperatively arranged such that proximity of the magnets causes at least one of the Hall effect sensors to output an altered voltage signal when orientation of the portable device in the base is incorrect; wherein at least a first of the Hall effect sensors outputs the altered voltage signal when an orientation of the portable device in the base includes correct front-to-back and incorrect top-to-bottom orientation, and wherein at least a second of the Hall effect sensors outputs the altered voltage signal when an orientation of the portable device in the base includes incorrect front-to-back and incorrect top-to-bottom orientation; and
 an alert system that, upon receiving the altered voltage signal from one of the first Hall effect sensor and the second Hall effect sensor, outputs an alert indicating that orientation of the portable device in the base is incorrect.

2. The mounting assembly of claim 1, wherein each of the Hall effect sensors is a digital Hall effect sensor.

3. The mounting assembly of claim 1, wherein the alert differs based upon whether the altered voltage signal is received from the first Hall effect sensor or the second Hall effect sensor.

4. The mounting assembly of claim 3, wherein the alert includes a graphical user interface that identifies the incorrect orientation of the portable device in the base.

5. The mounting assembly of claim 1,
 wherein at least a third of the Hall effect sensors outputs the altered voltage signal when the orientation of the portable device in the base includes incorrect front-to-back and correct top-to-bottom orientation, and wherein at least a fourth of the Hall effect sensors outputs the altered voltage signal when the orientation of the portable device in the base includes correct front-to-back and correct top-to-bottom orientation.

6. The mounting assembly of claim 5, further comprising an alert system that:
 determines if orientation of the portable device is correct or incorrect; and
 outputs an alert indicating that orientation of the portable device in the base is one of correct and incorrect based upon the determination.

7. The mounting assembly of claim 6, wherein the output alert includes a graphical user interface, and wherein if the orientation of the portable device in the base is incorrect, the graphical user interface identifies the incorrect orientation.

8. The mounting assembly of claim 1, wherein the portable device is a portable electronic scanning device.

9. A method for sensing full insertion of a portable device in a base that is geometrically conformed to mate with the portable device, the method comprising:
 providing the portable device with at least one magnet coupled therewith;
 providing the geometrically-conformed base with a first Hall effect sensor coupled therewith;
 detecting a first output-voltage profile for the first Hall effect sensor over a first period of time, the first period of time being associated with insertion of the portable device in the base; and
 comparing the first output-voltage profile to a first expected voltage profile for the first Hall effect sensor to determine if there is threshold similarity there between, wherein threshold similarity between the first output-voltage profile and the first expected voltage profile is indicative of full insertion of the portable device in the base, and wherein less than threshold similarity between the first output-voltage profile and the first expected voltage profile is indicative of inadequate insertion of the portable device in the base.

10. The method of claim 9, wherein comparing the first output-voltage profile of the first expected voltage profile comprises comparing the first output-voltage profile to the first expected voltage profile via a correlation technique that correlates the first time period with a second time period associated with the first expected voltage profile.

11. The method of claim 10, wherein the correlation technique is based on Dynamic Time Warping.

12. The method of claim 10, wherein the first Hall effect sensor is an analog all effect sensor, and wherein the method further comprises digitalizing output voltage comprising the first output-voltage profile.

13. The method of claim 9, wherein upon determining that the first output-voltage profile has less than the threshold similarity to the first expected voltage profile, the method further includes outputting an alert indicating that the portable device is inadequately inserted in the geometrically-conformed base.

14. The method of claim 12, wherein the geometrically-conformed base further includes:
 a mechanical locking mechanism;
 at least one magnet coupled with the mechanical locking mechanism; and
 a second Hall effect sensor positioned in association with the geometrically-conformed base such that the second Hall effect sensor outputs a second output-voltage profile as the position of the at least one magnet coupled with the locking mechanism varies.

15. The method of claim 14, further comprising:
detecting the second output-voltage profile over the first period of time; and
comparing the second output-voltage profile to a second expected voltage profile to determine if there is threshold similarity there between, wherein threshold similarity between the second output-voltage profile and the second expected voltage profile is indicative of an electrical locking of the portable device in the base.

16. The method of claim 15, wherein comparing the second output-voltage profile to the second expected voltage profile comprises comparing the second output-voltage profile to the second expected voltage profile via a correlation technique that correlates the first time period with a third time period associated with the second expected voltage profile.

17. The method of claim 16, wherein the correlation technique is based on Dynamic Time Warping.

18. The method of claim 16, wherein the second Hall effect sensor is an analog Hall effect sensor, and wherein the method further comprises digitalizing output voltage comprising the second output-voltage profile.

19. The method of claim 15, wherein upon determining that the second output-voltage profile has less than the threshold similarity to the second expected voltage profile, the method further includes outputting an alert indicating that the portable device is inadequately inserted in the geometrically-conformed base.

20. The method of claim 9, further comprising detecting a locking between the mechanical locking mechanism of the geometrically-conformed based and the portable device.

21. The method of claim 9, wherein the portable device is a portable electronic scanning device.

22. A method for sensing full insertion of a portable device in a base that is geometrically conformed to mate with the portable device, the portable device and the geometrically-conformed base comprising a mounting assembly, the method comprising:
calibrating the mounting assembly by:
measuring a first minimum voltage signal and a first maximum voltage signal output from a Hall effect sensor, the Hall effect sensor being arranged in association with the geometrically-conformed base such that the Hall effect sensor detects a magnetic field associated with at least one magnet coupled with a locking mechanism that temporarily secures the portable device in position when the portable device is fully inserted in the base, the first minimum voltage signal and the first maximum voltage signal being measured as the portable device is inserted in the base;
determining amplification values for the first minimum voltage signal and the first maximum voltage signal;
amplifying the first minimum voltage signal and the first maximum voltage signal utilizing the amplification values; and
storing the amplified minimum voltage signal and the amplified maximum voltage signal in association with the mounting assembly.

23. The method of claim 22, further comprising measuring a plurality of minimum voltage signals and a plurality of maximum voltage signals by detecting insertion of the portable device in the geometrically-conformed base a plurality of times, wherein one of the plurality of minimum voltage signals and a respective one of the plurality of maximum voltage signals is associated with each insertion of the portable device in the base.

24. The method of claim 23, further comprising averaging the plurality of minimum voltage signals to generate an averaged minimum voltage signal and averaging the plurality of maximum voltage signals to generate an averaged maximum voltage signal.

25. The method of claim 24, wherein amplifying the first minimum voltage signal and the first maximum voltage signal comprises amplifying the averaged minimum voltage signal and the averaged maximum voltage signal.

26. The method of claim 22, further comprising:
measuring a second minimum voltage signal and a second maximum voltage signal output from the Hall effect sensor, the second minimum voltage signal and the second maximum voltage signal being measured as the portable device is inserted in the base;
comparing the second minimum voltage signal to the first minimum voltage signal and the second maximum voltage signal to the first maximum voltage signal to determine if there is threshold similarity there between, wherein threshold similarity between the second minimum voltage signal and the first minimum voltage signal and between the second maximum voltage signal and the first maximum voltage signal is indicative of full insertion of the portable device in the base.

27. The method of claim 22, further comprising:
measuring a second minimum voltage signal and a second maximum voltage signal output from the Hall effect sensor, the second minimum voltage signal and the second maximum voltage signal being measured as the portable device is inserted in the base;
confirming that the portable device is fully inserted in the geometrically-conformed base; and
calibrating the mounting assembly by altering at least one of the measured second minimum voltage signal and the measured second maximum voltage signal to have at least threshold similarity to at least one of the first minimum voltage signal and the first maximum voltage signal.

* * * * *